(12) United States Patent
Schneider

(10) Patent No.: US 6,888,099 B1
(45) Date of Patent: May 3, 2005

(54) WIND TUNNEL FOR A WELDING POWER SUPPLY HOUSING

(75) Inventor: Joseph C. Schneider, Menasha, WI (US)

(73) Assignee: Illinois Tool Works Inc., Glenview, IL (US)

(*) Notice: Subject to any disclaimer, the term of this patent is extended or adjusted under 35 U.S.C. 154(b) by 113 days.

(21) Appl. No.: 10/248,970

(22) Filed: Mar. 6, 2003

(51) Int. Cl.[7] .............................................. B23K 9/10
(52) U.S. Cl. ................................. 219/130.1; 219/136
(58) Field of Search ............................. 219/56, 58, 74, 219/125.1, 125.11, 130.1; 72/169; 361/688, 694

(56) References Cited

U.S. PATENT DOCUMENTS

| | | | |
|---|---|---|---|
| 4,142,091 A | * | 2/1979 | Biethan, Sr. ............. 219/130.1 |
| 5,642,260 A | * | 6/1997 | Sigl ............................ 361/695 |
| 5,831,240 A | | 11/1998 | Katooka et al. |
| D417,650 S | | 12/1999 | Maiorano |
| 6,081,423 A | * | 6/2000 | Griffin ........................ 361/688 |
| 6,489,591 B1 | * | 12/2002 | Achtner ................... 219/130.1 |

* cited by examiner

Primary Examiner—Clifford C. Shaw
(74) Attorney, Agent, or Firm—Ziolkowski Patent Solutions Group, SC

(57) ABSTRACT

A system and method for a welding power supply housing is disclosed. The power supply housing includes a U-shaped panel positioned between two louvered end panels and a base. The combination of the U-shaped panel and the base forms a wind tunnel. The U-shaped panel includes a slot configured to receive a heat sink. The heat sink is in thermal connection with heat generating electrical components of the power supply and is exposed to the cooling flow within the wind tunnel thereby cooling the electrical components of the power supply.

27 Claims, 5 Drawing Sheets

WIND TUNNEL FOR A WELDING POWER SUPPLY HOUSING

BACKGROUND OF INVENTION

The present invention relates generally to welding systems and, more particularly, to a welding power supply housing assembly having a wind tunnel therein.

Welding power supply housings have a front panel which includes an on/off switch as well as controls such as power adjustment dials and output gauges. Additionally, the housing includes a rear panel and a cover panel. Such welding power supply housings must understandably enclose the entirety of the electrical components.

The housing, being fully enclosed, restricts natural convection cooling of the electronic components required to transform input energy into a desired form. Therefore, louvers are typically constructed into the front and rear panels to accommodate air flow through the housing. Fans have often been incorporated into the assembly of the welding power supply to facilitate improved cooling of the electrical components. Such air flow creates the additional problem of introducing heavy particulate flow into the interior of the housing. These particulates can build up on various components and can effectively shorten the life of certain electrical components of the power supply.

The electrical components can be classified into four general categories. The first category of component includes components that are preferably not physically attached to a circuit board and preferably not exposed to a cooling flow. Components would qualify for this category if, due to the size of the component, it would be impractical to physically attach the components to a circuit board and the component is adequately cooled by natural convection. The second category of components includes components that are preferably attached to the circuit board but are also preferably not exposed to a cooling flow. These components are physically attached to a circuit board of the power supply and cooled by a heat sink. The heat sink is also physically attached to the circuit board. The third category of components includes components that are preferably exposed to a cooling flow but preferably not physically attached to the circuit board. These components are those components that are also impractical to physically attach to the circuit board and also require more cooling than natural convection can provide. These components are also durable enough to withstand the particulates that are carried in the cooling flow. The fourth category of components includes components that are preferably exposed to the cooling flow and attached to the circuit board. These components are those components that can withstand the particulates carried in the cooling flow but, because of their size, can be attached to the circuit board.

Early cooling methods allowed for a cooling flow to follow a tortuous path through the entire power supply housing. Although this improved the cooling of the electrical components, it did not address the problem of particulate accumulation to certain electrical components because there was no separation between the cooling flow and the electrical components. Other methods of cooling the electrical components allow for isolation of preferred electrical components from the cooling flow. However, these methods increase the complexity of the assembly of the power supply and hinder assembly by preventing assembly of the electrical components of the power supply prior to installation of the electrical assembly within the power supply housing.

The method of electrical connectivity is another consideration of the present invention. There are several methods of connecting electrical components to circuit boards. These methods include hand soldering, mechanical connectors, and wave soldering, to name a few. Of these methods, the most preferable method of connecting the electrical components to the circuit board is by wave soldering. This method yields a higher quality connection between the component and the circuit board compared to hand soldering and mechanical connections.

Power supply assemblies that do separate certain electrical components from the cooling flow utilize partitioning of the housing. These systems connect the electrical components that can withstand being placed in a polluted cooling flow and heat sinks to one side of a partition and then connect the circuit board to the other side of the partition. The components mounted to the opposite side of the partition must then be electrically connected to the circuit board. This process of partitioning adds to both assembly time and cost. Additionally, these secondary electrical connections are often made by either hand soldering or using a mechanical means to make the connection because such an assembly is not conducive to wave soldering. These assemblies also do not provide for the fourth category of electrical components as discussed above. As such, components that are preferably exposed to the cooling flow must be attached to the housing and then electrically connected to the circuit board.

Therefore, it would be desirable to design a system and method capable of separating the electrical components into those that are preferred to be located in a cooling flow from those that are preferred to be located outside a cooling flow while also simplifying the assembly processes. Additionally, it would be desirable to have a system that allows for near completion of the electrical assembly prior to installation of the electrical assembly within the housing.

BRIEF DESCRIPTION OF INVENTION

The present invention is directed to a wind tunnel for a welding power supply housing that solves the aforementioned problems. The present invention provides a system and method for a welding power supply housing having a wind tunnel extending through the housing to allowing cooling of the various electrical components and at the same time isolates certain electrical components from particulates that may be carried in a cooling flow. Additionally, the present invention allows the heat sink and preferred electrical components to be attached to the circuit board prior to installation of the circuit board within the power supply housing. Upon connecting the circuit board assembly to the power supply housing assembly, the heat sink(s) and/or the preferred electrical components are exposed to the cooling flow within the wind tunnel. The present invention therefore allows exposure of a solder side of the circuit board when the power supply housing cover is removed.

Therefore, in accordance with one aspect of the present invention, a welder-type power supply housing includes a base with front and rear end panels mounted on opposite ends of the base. Each of the respective end panels includes an opening through the panel. A U-shaped panel is mounted to the base between the end panels and aligned with the openings therein. The U-shaped panel includes two side portions and a top portion. One of the side portions includes a slot. The slot in the side portion of the U-shaped panel is configured to receive a heat sink therein.

In accordance with another aspect of the present invention, a base, a cover, and a pair of end panels form a first chamber of a welding power supply housing. Located within the first chamber and aligned with the pair of end panels is a second chamber which forms a wind tunnel. One surface of the wind tunnel is formed by a heat sink. The addition of the heat sink completes the separation between the first chamber and the second chamber.

In accordance with a further aspect of the present invention, a U-shaped wind tunnel panel is mounted to a welder-type power supply housing base and located between a pair of end panels. The end panels include louvered openings therethrough. The louvered openings are aligned with the U-shaped wind tunnel panel such that air can flow in one end panel, through the wind tunnel, and out the second end panel.

In yet another aspect of the present invention, a method of assembling a welder-type assembly is disclosed that includes attaching at least one electrical component to a first side of a circuit board, attaching heat sink(s) to the circuit board and in thermal communication with the electrical components, and then mounting the circuit board to a housing such that the electrical component and the heat sink(s) are on a wind tunnel side of the housing.

Therefore, the present invention provides cooling of the electrical components of a welding-type apparatus while maintaining a separation between more sensitive electrical components and those less sensitive, and between the cooling flow within the wind tunnel and the convection cooling within the remainder of the welding-type power supply housing. The present invention also allows for construction of a nearly complete electrical assembly prior to the electrical assembly being mounted within the power supply housing. This configuration therefore allows for the use of wave soldering a majority of the connections of the electrical assembly.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
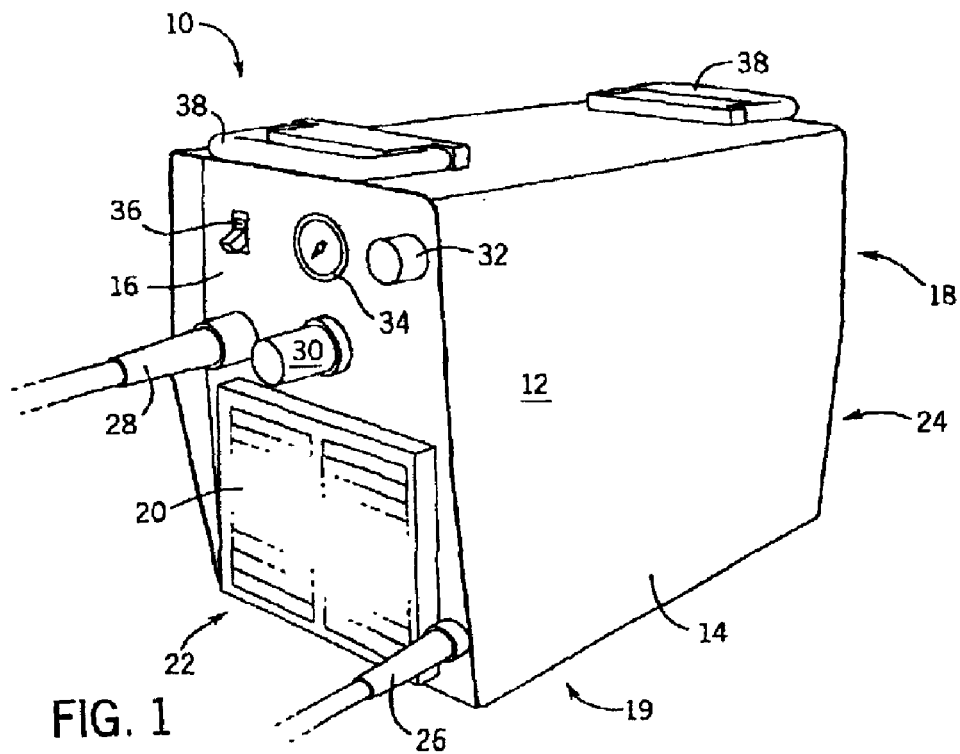
FIG. 1 is a perspective view of the welding power supply apparatus according to the present invention.

FIG. 1 shows a power supply 10 having a housing 12. The housing includes a cover 14, a front end panel 16, a rear end panel 18, and a base panel 19. Both the front and rear end panels 16, 18 include louvered openings 20. The end panels 16 and 18 include the louvered openings 20 to allow air to flow from a cooling inlet 22, through the power supply 10, and through a cooling exit 24. The cover 14 is attached to the front end panel 16, the rear end panel 18, and the base panel 19. FIG. 1 also shows: a welding ground lead 26, a welding power lead 28, a control knob 30, a power selector 32, an output gauge 34, and an on/off switch 36; all located in the front end panel 16. A pair of handles 38 is attached to the cover 14 to aid in moving the power supply 10.

Figure 2:
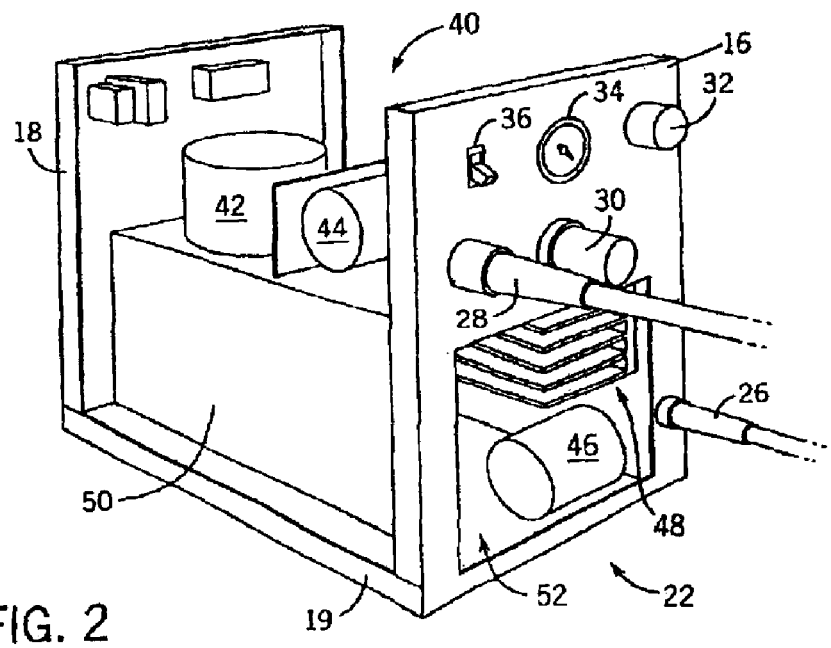
FIG. 2 is a perspective view of the front left side of that shown in FIG. 1 with the cover of the housing and the louvers of the end panel removed.

FIG. 2 shows the power supply 10 of FIG. 1 with the cover 14 removed to expose a first chamber 40. First chamber 40 is the space located between the cover 14, the front end panel 16, the rear end panel 18, and the base panel 19. A second chamber 52 is located within first chamber 40 and located under the U-shaped panel 50, between the front end panel 16, the rear end panel 18, and base panel 19. Second chamber 52 is also referred to herein as a wind tunnel that defines a space for cooling air flow through the power supply 10 as previously discussed. The U-shaped panel 50 is attached to the base panel 19 of the power supply 10 between the end panels 14, 16. Front end panel 16 is shown with louvered openings 20 removed to show a portion of an inside of the wind tunnel 52. This view shows a portion of a heat sink assembly 48 protruding into the wind tunnel 52. Also shown in FIG. 2 are electrical components 42, 44 attached to the U-shaped panel 50. Electrical components 42, 44 are those components that are preferably located in the first chamber 40 of the housing 12 and outside of the second chamber 52. Additionally, FIG. 2 shows electrical component 46. Component 46 is representative of any component that is preferably located within wind tunnel 52 of the welder housing 12.

Figure 3:
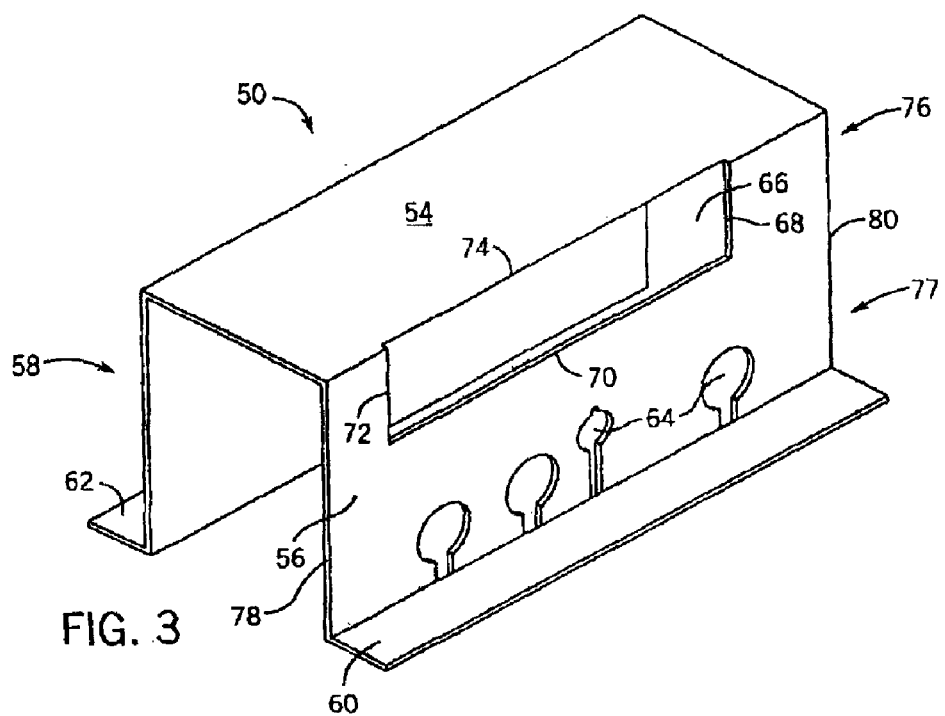
FIG. 3 is a top perspective view of a U-shaped wind tunnel as used in the apparatus of FIGS. 1 and 2.

FIG. 3 shows the U-shaped panel 50 of FIG. 2 in perspective view. The U-shaped panel 50, when viewed from the front, includes a right flange 60, a right side panel 56, a top panel 54, a left side panel 58, and a left flange 62. The top panel 54 connects the right and left side panels 56, 58 such that the two side panels 56, 58 are parallel to each other and each is perpendicular to the top panel 54. Each flange 60, 62 are also attached to the side panels 56, 58, respectively. The flanges 60, 62 are parallel to the top panel 54 and perpendicular to the side panels 56, 58. Flanges 60, 62 attach the U-shaped panel 50 to the base panel 19 of the power supply 10. The U-shaped panel 50 includes a front edge 78 and a rear edge 80. Edges 78, 80 meet with front and rear end panels 16, 18. The combination of front end panel 16, rear end panel 18, U-shaped panel 50, and base panel 19 form a separation between the first chamber 40 and the wind tunnel 52. At this point, there is still flow communication between the first chamber 40 and the wind tunnel 52 via a plurality of openings 64 and a longitudinal opening 66.

Openings 64 are located in a lower portion 77 of right side panel 56. Openings 64 are of various sizes and shapes to provide for communication between first chamber 40 and wind tunnel 52. These openings will be discussed further in reference to FIG. 7. Longitudinal opening 66 is located in an upper portion 76 of right side panel 56 and includes an opening rear edge 68, an opening bottom edge 70, an opening front edge 72, and an opening top edge 74. The longitudinal opening 66 is configured to receive heat sink assembly 48 therein but, similar to openings 64, could also be configured to receive other heat dissipating or heat generating components.

Figure 4:
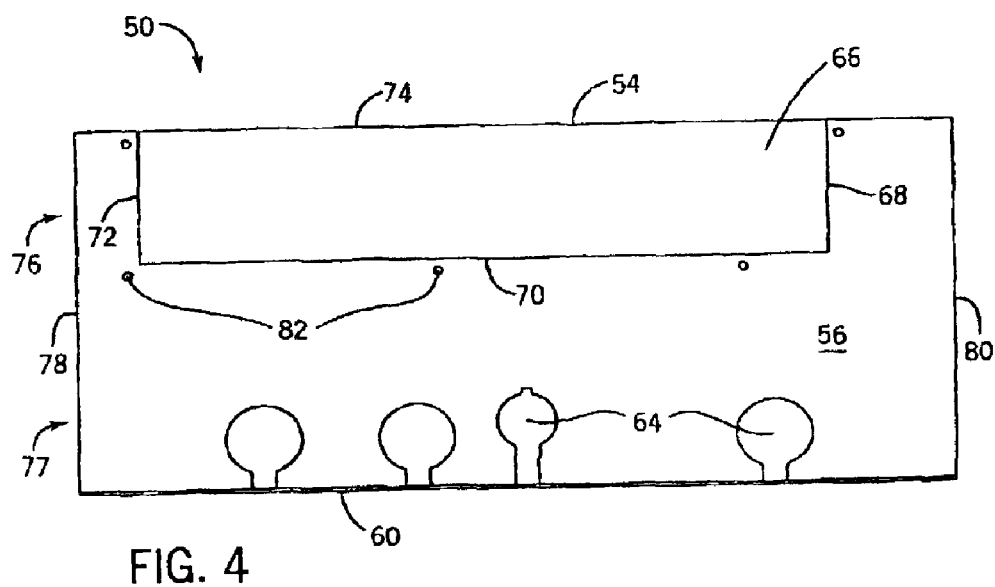
FIG. 4 is a side elevational view of that shown in FIG. 3.

FIG. 4 shows the right side panel 56 of U-shaped panel 50. Openings 64 are shown in a lower portion 77 of the right side panel 56 and extending to flange 60. Upper portion 76 of right side panel 56 contains the longitudinal opening 66.

Longitudinal opening 66 is preferably sized according to the desired size and shape of the heat sink(s) employed such that once mounted therein, longitudinal opening 66 snugly receives the heat sink(s) thereby both accommodating air flow through the wind tunnel 52 and effectively preventing excessive air flow within first chamber 40. Longitudinal opening 66 extends from right side panel 56 to top panel 54. Longitudinal opening 66 forms edges 68, 70, 72, and 74 in right side panel 56 of the U-shaped panel 50. Located within right side panel 56 and adjacent opening edges 68, 70, and 72, is a plurality of attachment holes 82 to attach a circuit board thereto.

Figure 5:
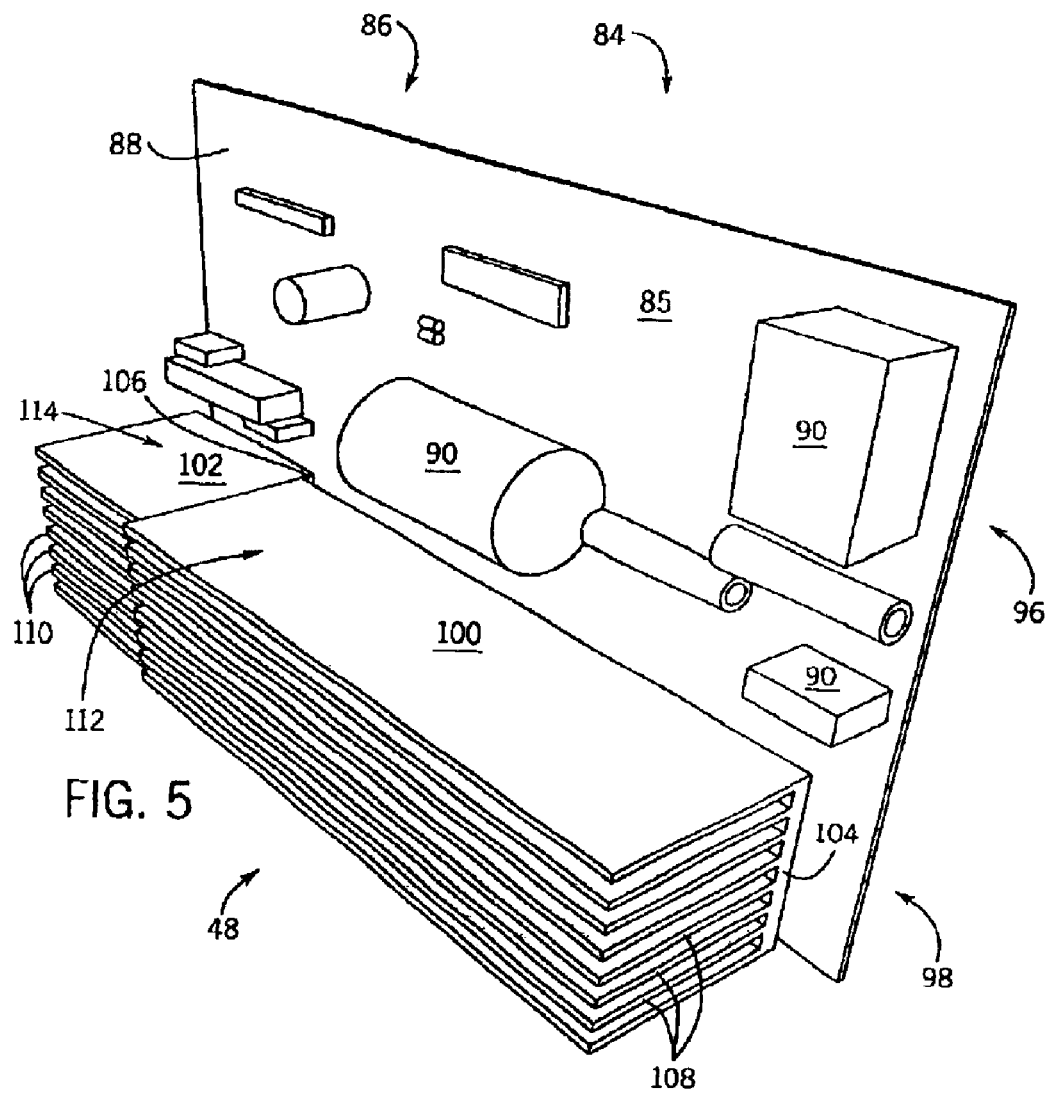
FIG. 5 is a perspective view of a circuit board with a heat sink mounted thereon for use with the wind tunnel of FIG. 3.

An exemplary circuit board assembly 84 is shown in FIG. 5. Circuit board assembly 84 includes a circuit board 85 that has a solder side 86 and a wind tunnel side 88. Circuit board 85 also includes an upper portion 96 and a lower portion 98. Upper portion 96 of component side 88 of circuit board 85 includes a plurality of electrical components 90. Electrical components 90, as shown, are those components that would be classified in the second category of electrical component as discussed above. These electrical components 90 are those components that are preferably located within the first chamber 40 and attached to circuit board 85 but not in the wind tunnel 52. In comparison, components 42, 44 shown in FIG. 2, categorized previously as the first category, are those components that are preferably located in the first chamber 40 but not in the wind tunnel, and preferably not attached to circuit board 85. The heat sink assembly 48 is attached to the lower portion 98 of the component side 88 of the circuit board 85. Heat sink assembly 48, in this embodiment, includes a pair of heat sinks 100, 102, but could equivalently include one or more heat sinks.

Each heat sink 100, 102 has a base 104, 106, a plurality of fins 108, 110, and an upper heat sink surface 112, 114. Fins 108, 110 are arranged to allow air flow thereover to cool the components that are in thermal communication therewith. The heat sink bases 104, 106 are connected to the circuit board 85 and are thereby in thermal communication with electrical components 90 located on the wind tunnel side 88 of the circuit board 85. The heat sinks 100, 102 are representative of the fourth category of electrical component discussed above. As such, the heat sinks 100, 102 are within that category of component that are preferably attached to the circuit board and exposed to the cooling flow within wind tunnel 52 but not within the first chamber 40. It is understood that heat sinks 100, 102 could also be heat generating components rather than heat dissipating components.

Figure 6:
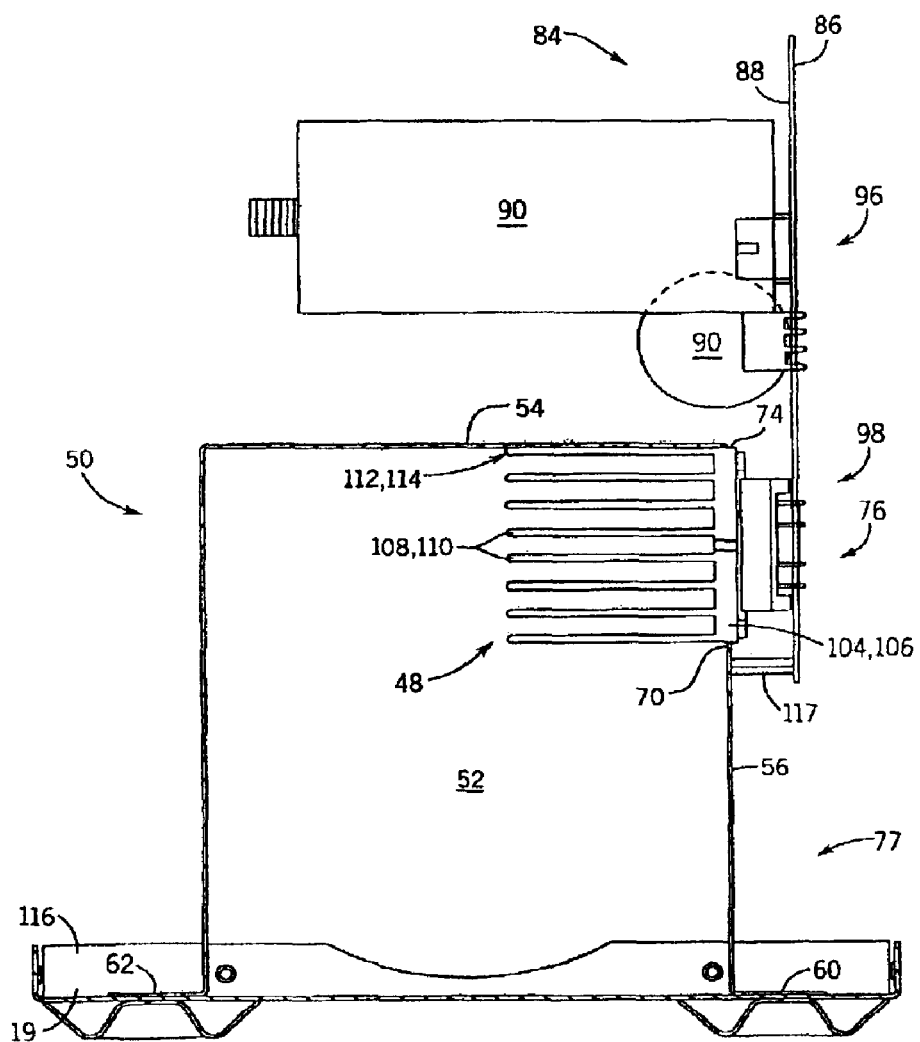
FIG. 6 is a side view of the heat sink and circuit board of FIG. 5 attached to the U-shaped wind tunnel of FIG. 3.

FIG. 6 shows the housing 12 of power supply 10 with the cover 14 and front and rear end panels 16 and 18 removed to expose a front end view of the circuit board assembly 84 attached to the U-shaped panel 50. Base 19 is shown attached to the U-shaped panel 50 at right side flange 60 and left side flange 62. An end view of wind tunnel 52 is shown as the area between U-shaped panel 50 and base 19. Circuit board assembly 84 is shown attached to U-shaped panel 50 via a means of attachment 117. Heat sink assembly 48 is inserted into longitudinal opening 66 of U-shaped panel 50 in a manner such that the heat sink assembly 48 protrudes into the wind tunnel 52. Heat sink assembly 48 is cooled by the flow through wind tunnel 52 thereby cooling electrical components 90 that are not located therein. The heat sink assembly 48 can be utilized to provide cooling to those electrical components in the first and second category as discussed above. These are the components that are preferably not exposed to the cooling flow of wind tunnel 52.

Heat sink bases 104, 106 meet with edges 68, 70, 72, and 74 of the longitudinal opening 66. Upper fin surfaces 112, 114 of the heat sink assembly 48 are shown oriented directly beneath top panel 54 of U-shaped panel 50. This orientation effectively eliminates flow communication between first chamber 40 and wind tunnel 52 through longitudinal opening 66. A plurality of attachment holes 82, shown in FIG. 4, receive the attachment means 117 and secure the circuit board assembly 84 to the U-shaped panel 50 thereby preventing pollutants carried on the cooling flow from entering first chamber 40 of the power supply housing 12.

Lower portion 98 of circuit board 85 of circuit board assembly 84 overlaps the upper portion 76 of right side panel 56 of U-shaped panel 50 thereby allowing longitudinal opening 66 to receive heat sink assembly 48. Upper portion 96 of circuit board 85 extends above U-shaped panel 50 thereby allowing electrical components 90 to extend from the upper portion 96 of the component side 88 of the circuit board 85 over the U-shaped panel 50. This construction allows for exposing solder side 86 of circuit board 85 by merely removing cover 14 of housing 12 of power supply 10. This orientation improves access to the solder side 88 of circuit board 85 of the electrical assembly 84 thereby improving the ease of assembly and maintenance of the power supply 10.

Figure 7:
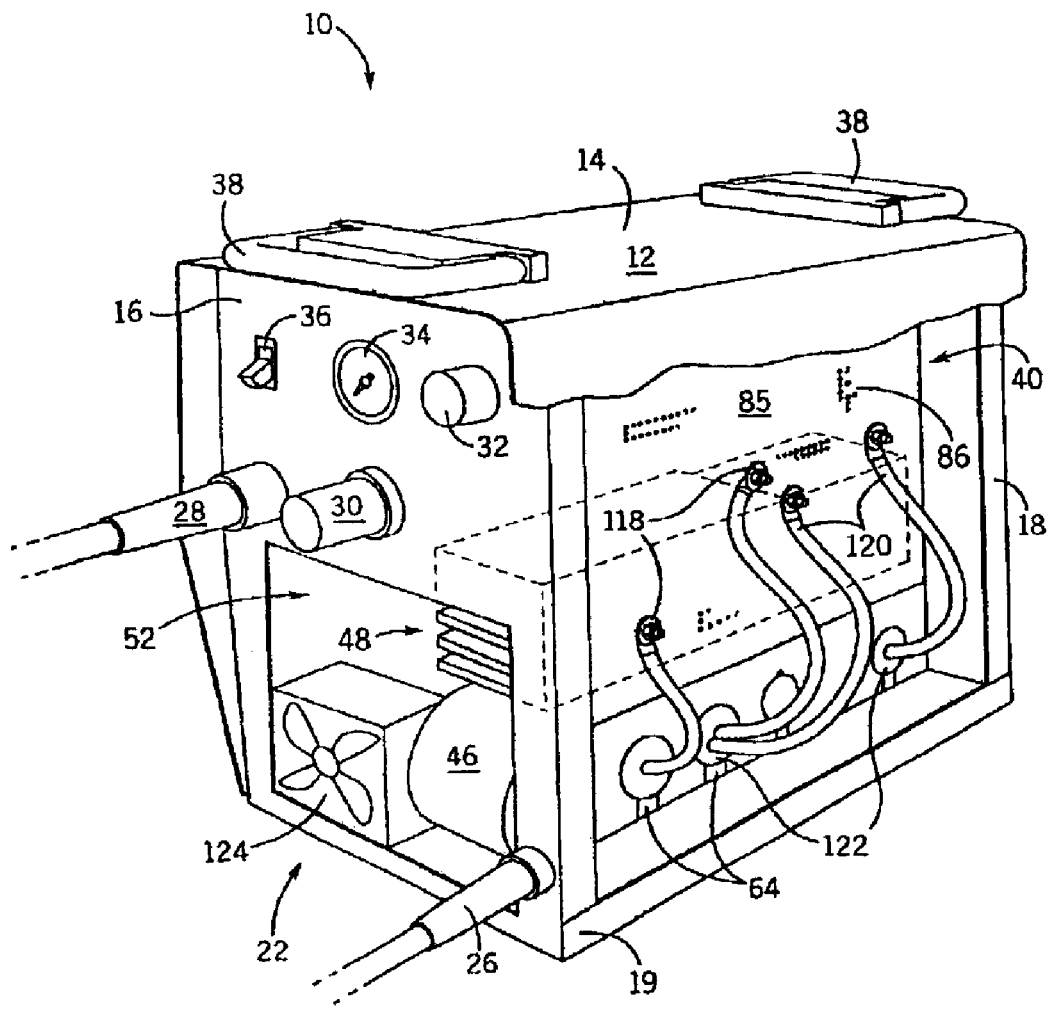
FIG. 7 is a perspective view of the front right side of the apparatus with a portion of the solder side of the circuit board exposed.

FIG. 7 shows power supply 10 with a portion of cover 14 removed. Solder side 86 of circuit board 85 is located between front end panel 16, rear end panel 18, base 19, and cover 14. FIG. 7 shows that the entirety of the solder side 86 of circuit board 85 of electrical assembly 84 is directly accessible after removal of cover 14 from housing 12 as discussed above. Circuit board 85 includes a plurality of connector terminals 118. Connector terminals 118 electrically connect electrical components 46 to the circuit board 85 of circuit board assembly 84. Connector terminals 118, although not shown, can also electrically connect electrical components 42, 44 to the circuit board 85 of the circuit board assembly 84. Connector terminals 118 electrically connect the first and third category of electrical components to the circuit board assembly 84. Connector terminals 118 electrically connect those components that are not physically mounted to the circuit board 85 to the circuit board assembly 85 through connector cables 120. Connector cables 120 extend between the electrical components 42, 44, 46 and the connector terminals 118 of the circuit board 85 of the circuit board assembly of 84.

Also shown in FIG. 7 is front end panel 16 with louvered openings 20 removed to expose a cooling inlet 22 therethrough. Electrical component 46, a fan 124, and a portion of heat sink assembly 48 are shown located within wind tunnel 48 of the power supply 10. Connector cables 120 from the electrical components 46 and fan 124 pass through openings 64, and terminate at connector terminals 118. Fan 124 and electrical components 46 are electrically connected to the circuit board assembly 84 via connector cables 120 that extend therefrom within the wind tunnel 52, through openings 64 of U-shaped pane) 50 of housing 12 of power supply 10, and terminate at connector terminals 118 of circuit board 85 of circuit board assembly 84. Connector cables 120 also pass through a plug 122. Plugs 122 sealing connect connector cables 120 to openings 64 of U-shaped panel 50. Openings 64 that do not have a connector cable 120 that passes therethrough are fitted with a solid plug 122.

Plugs 122 prevent air flow between first chamber 40 and wind tunnel 52 through the openings 64 of U-shaped panel 50 of housing 12. Plugs 122 complete the flow separation between the flow within wind tunnel 52 and any convection flows that may exist within first chamber 40. Air flow through wind tunnel 52 passes over a plurality of fins 108, 110 of heat sink assembly 48 and electrical components 46 thereby cooling these elements by direct exposure to the cooling flow. Heat sink assembly 48 effectively cools electrical components 90 that are attached to the circuit board 85 of circuit board assembly 84. Heat sink assembly 48 can also cool electrical components 42, 44 that are preferably in a first chamber 40 and not mounted to circuit board assembly 84. A fan 124 is mounted in wind tunnel 52 to increase the cooling flow therethrough and thereby increasing the cooling flow over plurality of fins 108, 110 of heat sink(s) 100, 102 of heat sink assembly 48 thereby improving cooling of the heat sink assembly 48 and those components thermally connected thereto.

The present invention relates to a housing of a welder-type power supply. The housing comprises a base, a front end panel, a rear end panel, a cover, and a U-shaped wind tunnel panel. The front and rear end panels are attached to opposing ends of the base. The underside of the cover encloses a first chamber between the pair of end panels and the base. The U-shaped wind tunnel panel is attached to the base and aligned with the front and rear end panels. The U-shaped panel, with the base and the end panels, defines a second chamber, or the wind tunnel. The end panels include louvered openings aligned with the U-shaped panel so that cooling air can flow into the housing through one end panel, through the U-shaped panel, and out of the housing through the second end panel.

The U-shaped panel includes a longitudinal opening located in an upper portion of a side of the U-shaped panel. The longitudinal opening is configured to receive a heat sink(s) therein. The shape of the opening is substantially similar to the shape of the heat sink(s) so that the heat sink(s) effectively seal the longitudinal opening in the U-shaped panel thereby preventing the cooling flow within the wind tunnel from flowing into the first chamber through the longitudinal opening.

Therefore, in accordance with one embodiment of the present invention, a wind tunnel is formed by mounting a U-shaped wind tunnel panel to a base of a welder-type power supply between a front end panel and a rear end panel. Each of the end panels also includes an opening therethrough. The U-shaped panel includes a top and two side portions. One of the side portions includes an opening sized to receive a heat sink therein.

In accordance with another embodiment of the present invention, a base, a pair of housing end panels attached to the base, and a cover attached thereto form a first chamber. Located within the first chamber is a second chamber which forms a wind tunnel. At least one surface of the wind tunnel is formed by a heat sink.

In accordance with a further embodiment of the present invention, a housing for a welder comprising a base of a welder-type power supply, a pair of louvered end panels, and a cover mounted to the pair of end panels and the base thereby forming a first enclosure. A U-shaped wind tunnel is located between the pair of end panels, aligned with the louvers therein, and mounted over the base panel so that air can flow through one end panel, through the wind tunnel, and through another end panel.

In accordance with still a further embodiment of the present invention, a method of assembly of a welder-type assembly is provided that calls for attaching at least one electrical component to a first side of a circuit board, attaching at least one heat sink (s) to the circuit board and in thermal communication with the electrical components, and then mounting the circuit board to a welder-type power supply housing such that the at least one electrical component and the at least one heat sink are on a wind tunnel side of the welder-type power supply housing.

As one skilled in the art will fully appreciate, the heretofore description of welding devices not only includes welders, but also includes any system that requires high power outputs, such as heating and cutting systems. Therefore, the present invention is equivalently applicable with any device requiring high power output, including welders, plasma cutters, induction heaters, and the like. Reference to welding power, welding-type power, or welders generally, includes welding, cutting, or heating power. Description of a welding apparatus illustrates just one embodiment in which the present invention may be implemented. The present invention is equivalently applicable with many high power systems, such as cutting and induction heating systems, or any similar systems.

The present invention has been described in terms of the preferred embodiment, and it is recognized that equivalents, alternatives, and modifications, aside from those expressly stated, are possible and within the scope of the appending claims.

What is claimed is:

1. A wind tunnel for a welder comprising:
   a base of a welding-type power supply;
   front and rear end panels mounted on opposite ends of the base, each having an opening therein; and
   a U-shaped panel mounted to the base and attached about the openings of the front and rear end panels, the U-shaped panel having two side portions and a top portion, wherein at least one of the side portions has therein a slot to receive a component inside the U-shaped panel to form a substantially closed tunnel from the front panel to the rear panel.

2. The wind tunnel of claim 1 further comprising a heat sink mounted in the slot and a circuit board attached to the heat sink.

3. The wind tunnel of claim 2 wherein at least a portion of the circuit board extends above the U-shaped panel.

4. The wind tunnel of claim 1 further comprising a pair of louvered end panels attached to the respective ends of the U-shaped panel and the base.

5. The wind tunnel of claim 1 further comprising a fan located between the U-shaped panel and the base.

6. The wind tunnel of claim 1 wherein the slot is a longitudinal opening of sufficient size so as to receive at least one heat sink therein.

7. The wind tunnel of claim 1 wherein the slot is at a top portion of the at least one side portion.

8. A housing for a welder comprising:
   a first chamber defined by a welder-type housing comprising a base, a first and second end panels mounted on respective ends of the base, and a cover mounted to the end panels; and
   a second chamber extending between the first and second end panels within the first chamber forming a wind tunnel wherein at least one surface of the wind tunnel is formed by a heat sink and wherein the second chamber substantially isolates the wind tunnel from the first chamber.

9. The housing of claim 8 further comprising a circuit board having the heat sink mounted thereon and wherein the circuit board is mounted to the second chamber.

10. The housing of claim 8 wherein the first and second panels have louvers formed therein.

11. The housing of claim 10 wherein a solder side of the circuit board is exposed when the cover of the housing is removed.

12. The housing of claim 8 further comprising a fan located within the wind tunnel to direct air through the wind tunnel and cool the heat sink.

13. The housing of claim 8 wherein the second chamber includes a plurality of heat sinks mounted therethrough.

14. The housing of claim 8 wherein the at least one surface of the wind tunnel is located in a vertical side surface of the second chamber.

15. A method of assembling a welder-type assembly comprising:
   attaching at least one electrical component to a first side of a circuit board;
   attaching at least one heat sink to the first side of the circuit board and in thermal communication with the at least one electrical component; and
   attaching the circuit board to a welder-type power supply housing such that the at least one heat sink and the at least one electrical component are on a wind tunnel side of the welder-type power supply housing.

16. The method of claim 15 further comprising forming the housing in a U-shaped configuration and mounting the housing to a base of the welder to form the wind tunnel.

17. The method of claim 16 further comprising attaching the circuit board to the U-shaped housing so that the at least one heat sink extends therethrough.

18. The method of claim 15 wherein the circuit board is mounted such that a solder side is exposed with respect to the wind tunnel and further comprising wave soldering electrical connectors of the welder to the circuit board.

19. The method of claim 15 further comprising attaching a fan within the wind tunnel.

20. A housing for a welder comprising:
   a base of a welder-type power supply housing;
   a pair of end panels having louvers to allow air flow therethrough;
   a cover mounted to the pair of end panels and the base to form a first enclosure; and
   a U-shaped wind tunnel extending to each of the pair of end panels and mounted over the base to allow air flow from one end panel through the wind tunnel and through another end panel.

21. The housing of claim 20 further comprising a circuit board having mounted thereon a heat sink, the circuit board and heat sink being mounted to the U-shaped wind tunnel such that the heat sink is within the wind tunnel and a solder side of the circuit board is outside the wind tunnel.

22. The housing of claim 20 wherein the U-shaped panel has three sides and at least one side has therein an opening to receive a component that requires cooling in the wind tunnel.

23. The housing of claim 22 wherein the U-shaped panel opening has a shape that corresponds to an outline of a heat sink such that the heat sink fills the opening when installed therein.

24. The housing of claim 22 wherein the opening in the U-shaped panel is confined within the three sides and receives therein a heat sink.

25. The housing of claim 24 wherein the opening in the U-shaped panel is located in an upper portion of one of the parallel sides.

26. The housing of claim 20 further comprising a fan mounted within the wind tunnel to direct air therethrough.

27. The housing of claim 20 wherein the U-shaped wind tunnel includes an opening between the wind tunnel and the first enclosure.

* * * * *